(12) United States Patent
Islam et al.

(10) Patent No.: US 8,614,472 B1
(45) Date of Patent: Dec. 24, 2013

(54) SYSTEMS AND METHODS FOR ADJUSTING ULTRA-SMALL METAL-OXIDE-METAL CAPACITORS

(75) Inventors: Syed S. Islam, Cupertino, CA (US); Mansour Keramat, San Jose, CA (US)

(73) Assignee: Integrated Device Technology, Inc., San Jose, CA (US)

(*) Notice: Subject to any disclaimer, the term of this patent is extended or adjusted under 35 U.S.C. 154(b) by 0 days.

(21) Appl. No.: 13/214,136

(22) Filed: Aug. 19, 2011

(51) Int. Cl.
*H01L 27/108* (2006.01)
*H01L 29/94* (2006.01)

(52) U.S. Cl.
USPC ............ 257/312; 257/301; 257/302; 257/303; 257/304; 257/305; 257/306; 257/307; 257/532; 257/E29.342; 257/E29.343; 257/E29.344; 257/E29.345; 361/283.3; 361/299.1; 361/301.1

(58) Field of Classification Search
CPC .............. H01L 29/93; H01L 27/10829; H01L 27/10832; H01L 27/10835; H01L 27/10838; H01L 27/10841; H01L 27/10861; H01L 27/10864; H01L 27/10867; H01L 27/10876; H01L 27/10852; H01L 27/10855; H01L 27/10858; H01L 27/10808; H01L 27/10811; H01L 27/10814; H01L 27/1082; H01L 27/0805; H01L 29/66181; H01L 29/66189; H01L 29/945; H01L 29/92; H01L 28/40; H01L 23/5223; H01L 23/5225
USPC ........... 257/532, E29.342, E29.343, E29.344, 257/E29.345, 301, 302, 303, 304, 305, 306, 257/307, 312; 361/283.3, 299.1, 301.1
See application file for complete search history.

(56) References Cited

U.S. PATENT DOCUMENTS

| | | | | |
|---|---|---|---|---|
| 3,903,543 | A | * | 9/1975 | Smith .......................... 257/240 |
| 6,510,545 | B1 | * | 1/2003 | Yee et al. ...................... 716/126 |
| 2003/0063427 | A1 | * | 4/2003 | Kunihiro ....................... 361/277 |
| 2007/0075350 | A1 | * | 4/2007 | Darabi et al. .................. 257/312 |
| 2010/0061035 | A1 | * | 3/2010 | Kitamura et al. ............ 361/301.4 |

* cited by examiner

*Primary Examiner* — Kenneth Parker
*Assistant Examiner* — David Chen
(74) *Attorney, Agent, or Firm* — Heimlich Law, PC; Alan Heimlich, Esq.

(57) ABSTRACT

An integrated circuit metal oxide metal (MOM) variable capacitor includes a first plate; one or more pairs of second plates positioned on both sides of the first plate; one or more pairs of control plates positioned on both sides of the first plate and positioned between the pairs of second plates; and a switch coupled to each control plate and a fixed potential.

20 Claims, 6 Drawing Sheets

SYSTEMS AND METHODS FOR ADJUSTING ULTRA-SMALL METAL-OXIDE-METAL CAPACITORS

BACKGROUND

This invention relates generally to adjustable metal-oxide-metal capacitors.

Capacitors are widely used in integrated circuits. One of the most commonly used capacitors is the metal-insulator-metal (MIM) capacitor. A typical MIM capacitor has top and bottom plates and insulation layer in between. The capacitance of a capacitor is proportional to its area and the dielectric constant (k) of the insulation layer, and is inversely proportional to the thickness of the insulation layer. Therefore, to increase the capacitance, it is preferable to increase the area and k value and to reduce the thickness of the insulation layer.

Metal-Oxide-Metal (MOM) capacitor is widely used in precision and high-frequency mixed-signal circuits such as Analog-to-Digital Converter (ADC), Digital-to-Analog Converters (DAC), Programmable Gain Amplifier (PGA), among others. MOM capacitors are less expensive compared to MIM capacitors as MIM capacitors need extra mask layers for fabrication. Also, MOM capacitors can be used for sub-femto farad unit-cells while the minimum size of the MIM capacitor unit-cells is tens of femto farads. MOM capacitors are voltage and temperature independent. Another important feature of MOM capacitor is that their values can be easily programmable by adding/removing MOM capacitor fingers using Metal-Oxide-Semiconductor Field Effect Transistor (MOSFET) switches.

FIG. 1 shows an exemplary PGA with an op-amp 5 whose gain is controlled by a MOM capacitor bank 10 and a capacitor 20. FIG. 2 shows an exemplary layout of the capacitor bank 10 with parallel branches each including a capacitor layout 12A in series with a switch layout 14A. The MOM capacitor bank supports programmable capacitor values to adjust gain factors. In conventional method, as shown in FIG. 1, the capacitance of a MOM capacitor bank 10 can either added or removed by closing or opening one or more series switches 14. The series switch 14 introduces following problems, among others:

1) The switch limits the operating bandwidth.
2) The switch can impact the noise content.
3) In high resolution capacitor adjustment, the switch area is a concern and places a restriction on minimum unit cell size.
4) The common-mode voltage affects the switch resistance and linearity of the circuit.

SUMMARY

In one aspect, an integrated circuit metal oxide metal (MOM) variable capacitor includes a first plate; one or more pairs of second plates positioned on both sides of the first plate; one or more pairs of control plates positioned on both sides of the first plate and positioned between the pairs of second plates; and a switch coupled to each control plate and a fixed potential.

Advantages of the preferred embodiments can include one or more of the following. The control plates can be connected by a metal layer. The second plates can be connected by a metal layer. The control plates can be connected by a first metal layer and the second plates are connected by a second metal layer. The can be fixed potential can be ground. The plates can form an equivalent capacitance with a base capacitance $C_{base}$ in parallel with a capacitance between the first plate and a first control plate $C_{ax}$ and a capacitance between a second plate and the first control plate $C_{bx}$. An operational amplifier can be connected to the output of the variable capacitor to form a programmable gain amplifier (PGA). The plates can form an equivalent capacitance with a base capacitance $C_{base}$ in parallel with a capacitance between the first plate and a first control plate $C_{ax}$ and a capacitance between a second plate and the first control plate $C_{bx}$, further comprising a capacitor $C_f$ coupled to the input and output of the operational amplifier, wherein a PGA gain can be:

$$G = -\frac{\left[C_{base} + \frac{C_{ax}C_{bx}}{C_{ax} + C_{bx}}\right]}{C_f} \text{ (switch open)}$$

$$G = -\frac{C_{base}}{C_f} \text{ (switch closed)}.$$

A minimum value of capacitor step size depends on an overlap area between the first and second plates and control plates. The switch resistance is not in series with the output of the variable capacitor.

Advantages of the preferred embodiment may include one or more of the following. The capacitor structure does not require switches in series with the adjustable capacitor segments. The capacitor has reduced impact on signal bandwidth and noise. Switches connected to the control plates do not appear in the signal path. Minimum size switches can be used. The structure offers a high capacitance density ($>1$ fF/$\mu m^2$). The structure also provides very fine steps of capacitance variation ($>50$ aF).

BRIEF DESCRIPTION OF THE FIGURES

For a more complete understanding of the various implementations of the invention, and the advantages thereof, reference is now made to the following descriptions taken in conjunction with the accompanying drawings, in which.

DESCRIPTION

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

In the preferred embodiment, the variable capacitance of a MOM capacitor bank is adjusted by modifying an electric field. This method is well-suited for sub-femto farad unit-cells. The switches are not placed in series with the capacitor and their size can be the minimum size for a switch.

Figure 1:
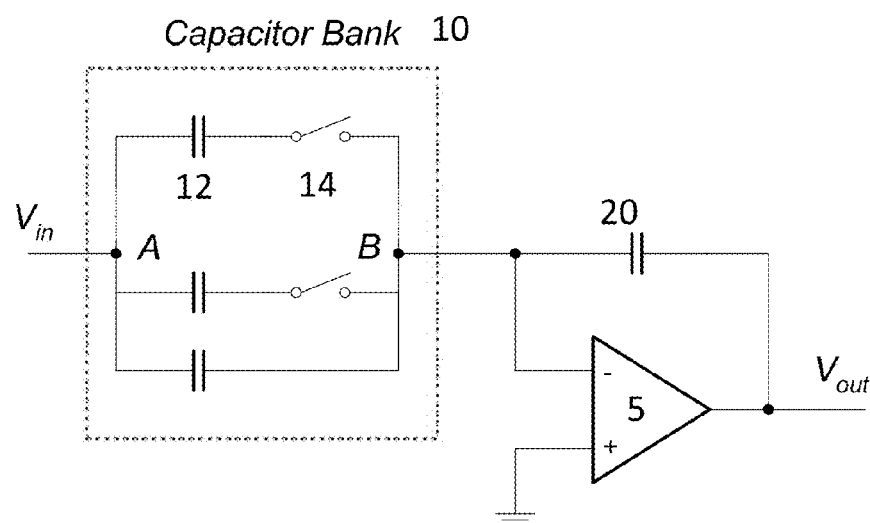
FIG. 1 shows an exemplary PGA with an op-amp.
Figure 2:
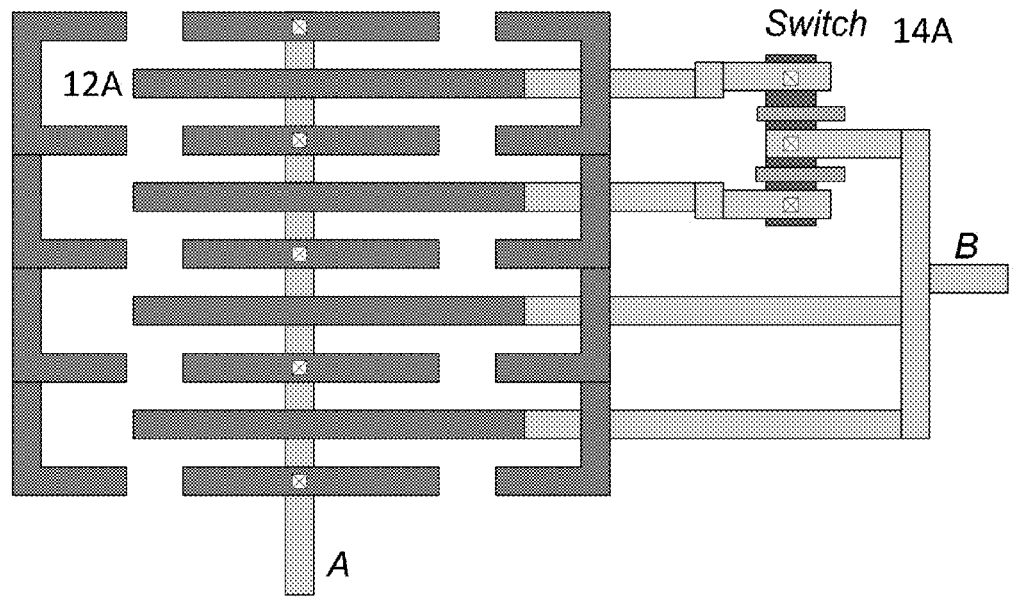
FIG. 2 shows a conventional layout of the capacitor bank.
Figure 3:
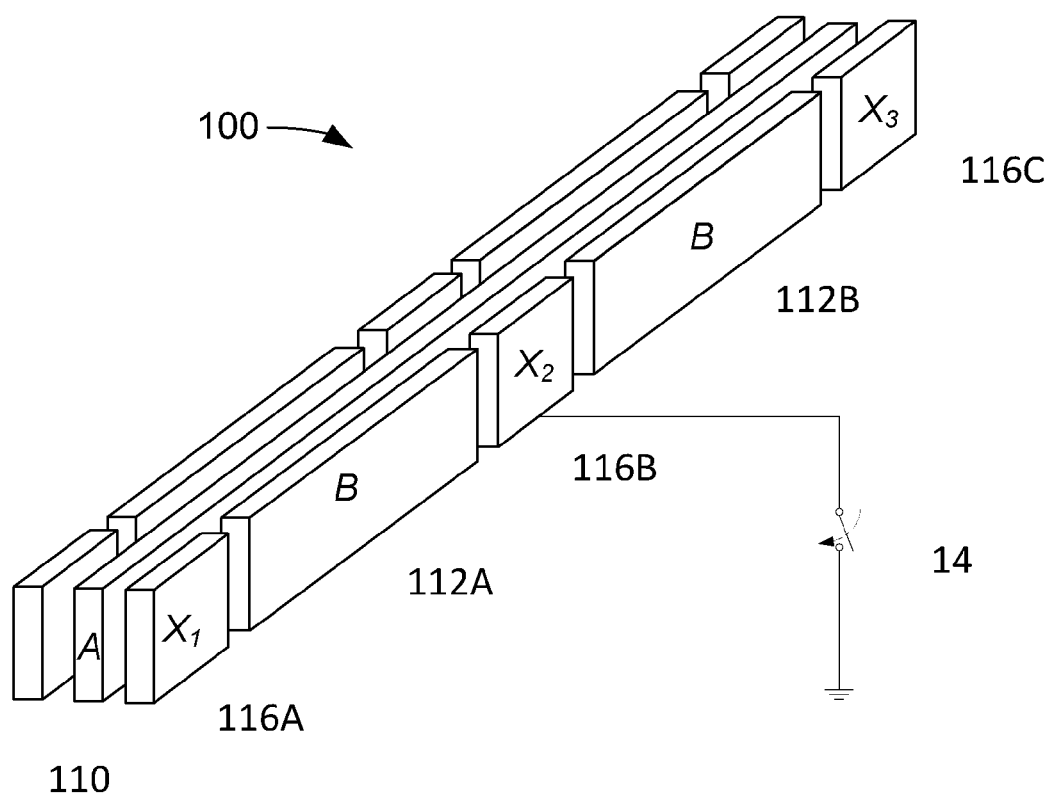
FIG. 3 shows a first embodiment of a capacitor bank to provide variable capacitance.

FIG. 3 shows a first embodiment of a capacitor bank to provide variable capacitance. As shown in FIG. 3, the capacitor bank 100 uses control plates ($X_1$ 116A, $X_2$ 116B, $X_3$ 116C) in between main plates (A 110 and B 112A-112B). Each of the metal plates or electrodes 110 and 112A-112B forms a three-dimensional structure with more than one layer connected by vias, and each layer is formed in a metallization layer commonly used for the formation of interconnect structures. In addition to the capacitance in each of the metallization layers, the capacitance of capacitor bank 100 also includes portions created by the overlap between the different layers, and the overlapped portions contribute to the total capacitance of capacitor bank 100. In FIG. 3, the control plates ($X_1$ 116A, $X_2$ 116B, $X_3$ 116C) are smaller and isolated.

Figure 4:
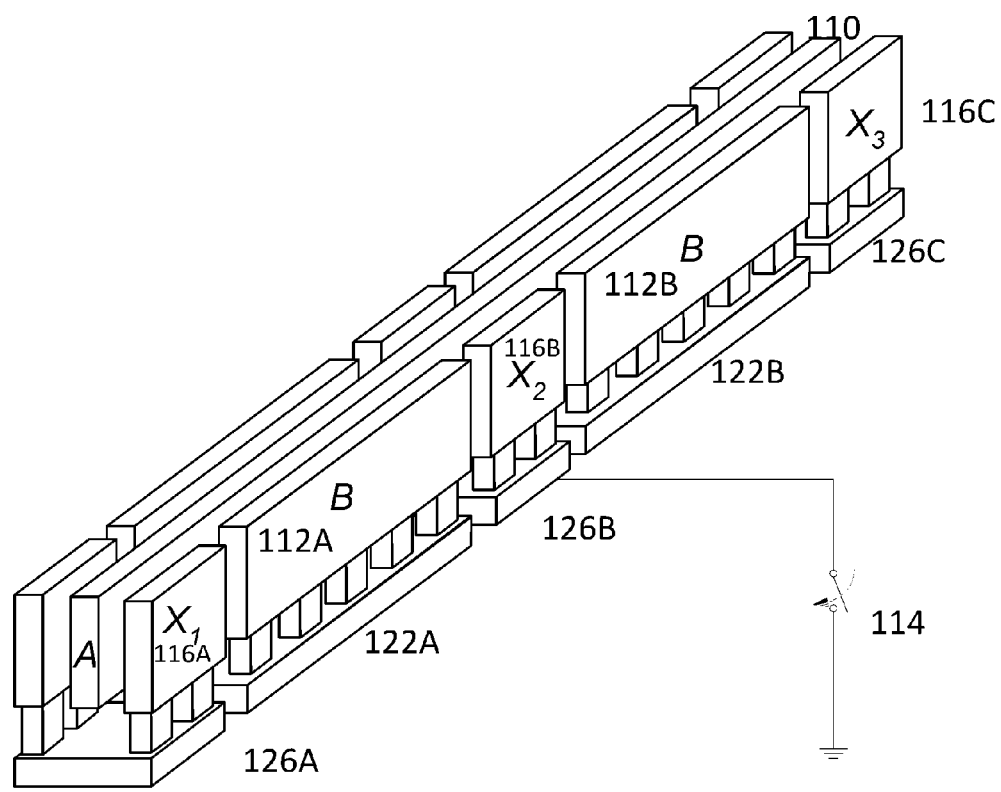
FIG. 4 shows a second embodiment of a capacitor bank to provide variable capacitance.
Figure 5:
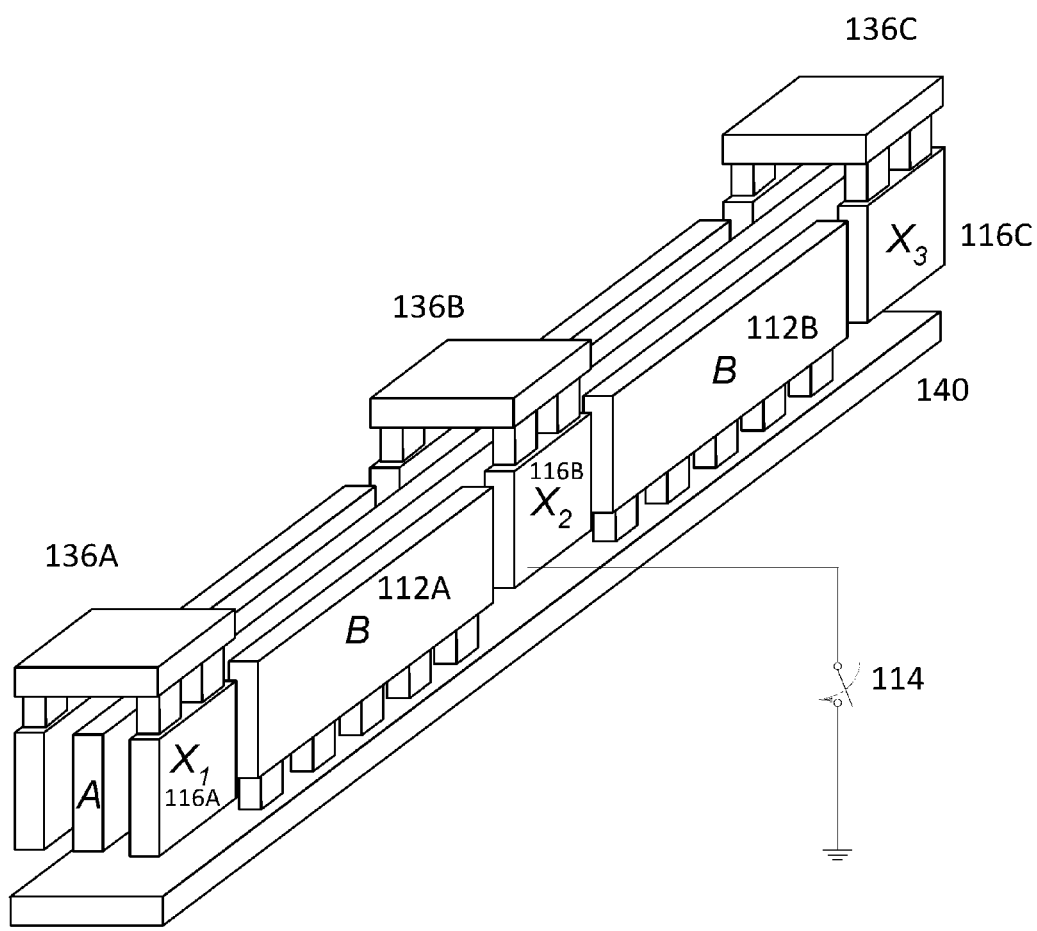
FIG. 5 shows a third embodiment of a capacitor bank to provide variable capacitance.

FIGS. 4-5 show variations of FIG. 3. In FIG. 4, the main plate B 112A and control plates 116A, 116B and 116C are formed on both sides of main plate A 110 and are connected through bottom metal connections 126A, 126B and 126C, respectively. Similarly, B plates 112A and 112B are connected through bottom metal connections 122A and 122B, respectively.

In FIG. 5, control plates ($X_1$ 116A, $X_2$ 116B, $X_3$ 116C) are connected by top metal connection 136A, 136B and 136C, respectively. The main plates B 112A and 112B are connected by bottom metal connection 140. The control plates are connected to ground (or a fixed potential) through MOSFET switches (not shown). The control plates ($X_1$ 116A, $X_2$ 116B, $X_3$ 116C) modify the electric field between the main plates 110 and 112A-112B, depending on the mode of the switches.

Figure 6:
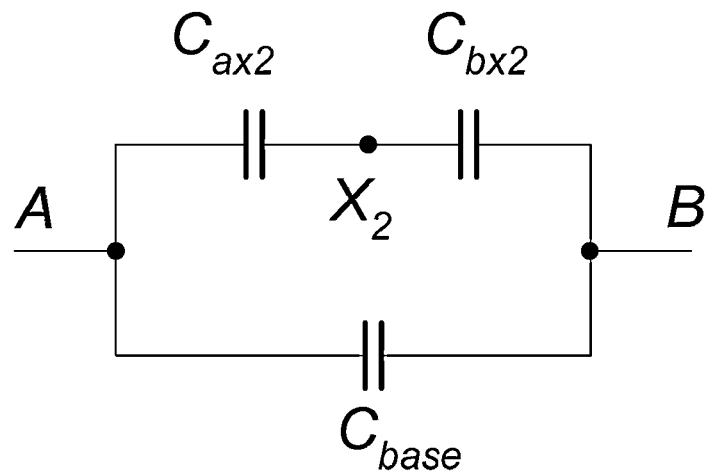
FIGS. 6-7 show exemplary equivalent capacitances between plates A and B when the switch is opened or closed.
Figure 7:
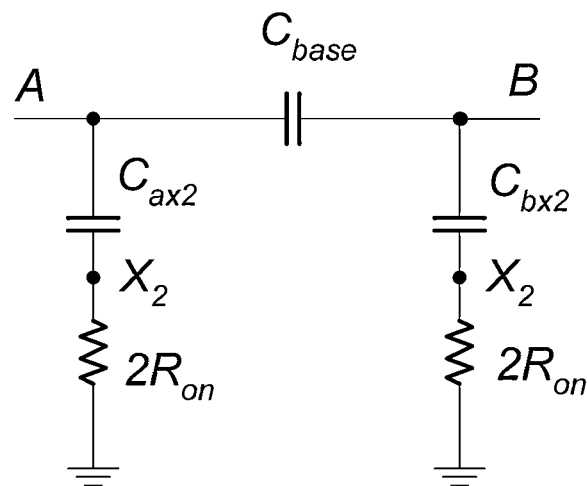

In the above description, a switch is connected between $X_2$ plate and ground. Similar switches can be connected to all other control plates. The equivalent capacitances between plates A and B when the switch is opened or closed are shown in FIGS. 6-7, respectively. In these figures, $C_{base}$ is the capacitance between main plates A and B, $C_{ax2}$ and $C_{bx2}$ are the capacitances between plates A and $X_2$ and B and $X_2$, respectively, and $R_{on}$ is the ON resistance of the switch.

Figure 8:
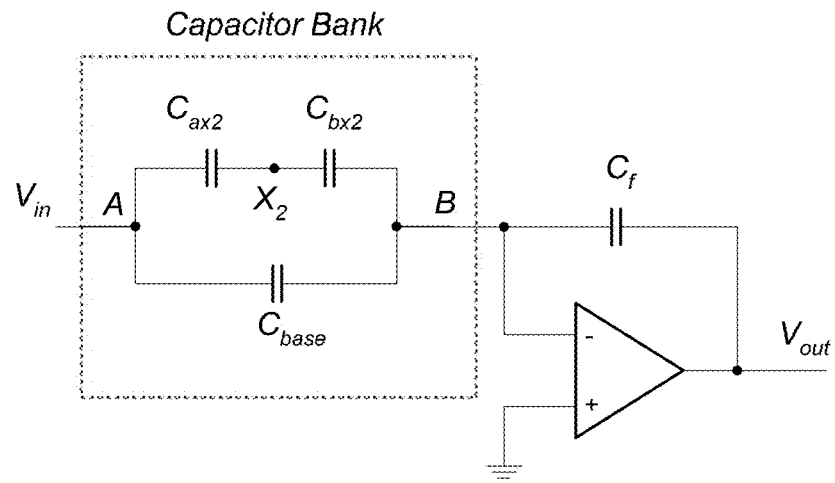
FIGS. 8-9 show exemplary equivalent circuits based on the switch configuration.
Figure 9:
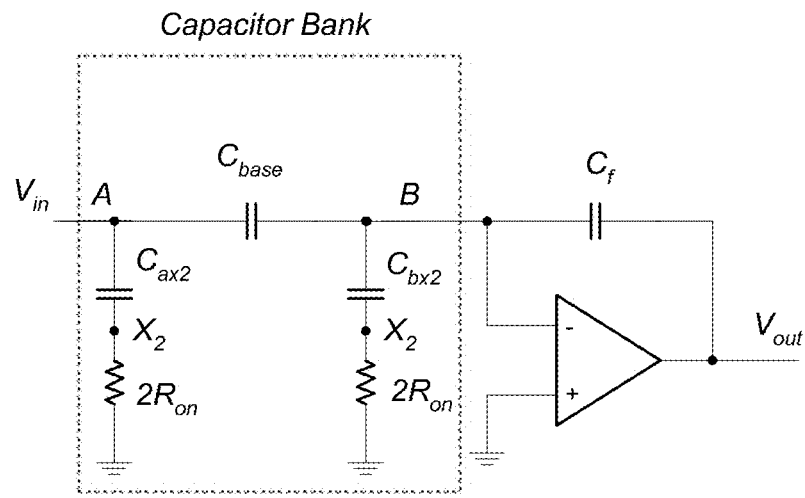

One exemplary application for the structures shown in FIGS. 3-5 is in a PGA circuit. FIGS. 8-9 show exemplary equivalent circuits based on the switch configuration. In FIG. 8, the switch between $X_2$ and ground is opened, while FIG. 9 shows the equivalent circuit when the switch between $X_2$ and ground is closed.

The PGA gain when the switch between $X_2$ and ground is opened or closed is given below:

$$G = -\frac{\left[C_{base} + \frac{C_{ax2}C_{bx2}}{C_{ax2} + C_{bx2}}\right]}{C_f} \text{ (switch open)}$$

$$G = -\frac{C_{base}}{C_f} \text{ (switch closed)}.$$

The switch resistance is not electrically in series with the programmable capacitor. As a result, the sizes of the switches can be smaller. Also, a wide range of capacitance and very fine steps of input capacitor (i.e., gain) variation are possible by connecting switches to other control plates.

The series combination of $C_{ax2}$ and $C_{bx2}$ determines the minimum value of capacitor step size. This is dependent on the overlap area between main and control plates. The structure of FIG. 3 gives the finest step size while the structure of FIG. 5 gives the largest step size. The step size of 5%~20% of $C_{base}$ can be implemented with the disclosed structure.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An integrated circuit metal oxide metal (MOM) variable capacitor, comprising:

a first plate of the MOM variable capacitor;

two or more pairs of second plates positioned parallel to, and a predetermined distance from, both sides of the first plate;

one or more pairs of control plates positioned parallel to, and the predetermined distance from, both sides of the first plate and positioned between the two or more pairs of second plates; and a switch coupled to each control plate and a fixed potential source.

2. The capacitor of claim 1, wherein the one or more pairs of control plates are connected by a metal layer.

3. The capacitor of claim 1, wherein the two or more pairs of second plates are connected by a metal layer.

4. The capacitor of claim 1, wherein the one or more pairs of control plates are connected by a first metal layer and the two or more pairs of second plates are connected by a second metal layer.

5. The capacitor of claim 1, wherein the fixed potential source comprises ground.

6. The capacitor of claim 1, wherein the two or more pairs of second plates and the first plate form a capacitance value denoted as a base capacitance $C_{base}$ in parallel with a capacitance value formed between the first plate and a first control plate of the one or more pairs of control plates denoted as $C_{ax}$ and a capacitance value formed between a second plate of the two or more pairs of second plates and the first control plate denoted as $C_{bx}$.

7. The capacitor of claim 1, further comprising an operational amplifier coupled to the variable capacitor to form a programmable gain amplifier (PGA).

8. The capacitor of claim 7, wherein the two or more pairs of second plates and the first plate form a capacitance value denoted as a base capacitance $C_{base}$ in parallel with a capacitance value formed between the first plate and a first control plate of the one or more pairs of control plates denoted as $C_{ax}$ and a capacitance value formed between a second plate of the two or more pairs of second plates and the first control plate denoted as $C_{bx}$, further comprising a capacitor $C_f$ coupled to an input and an output of the operational amplifier, wherein a PGA gain G comprises:

$$G = -\frac{\left[C_{base} + \frac{C_{ax}C_{bx}}{C_{ax}+C_{bx}}\right]}{C_f} \text{ (switch open)}$$

$$G = -\frac{C_{base}}{C_f} \text{ (switch closed).}$$

9. The capacitor of claim 1, wherein a minimum value of capacitor capacitance step size depends on an overlap area between the first and second plates and control plates.

10. The capacitor of claim 1, wherein a resistance of the switch is not in series with an output of the variable capacitor.

11. A method for forming an integrated circuit metal oxide metal (MOM) variable capacitor, comprising:
sandwiching parallel to a first plate by two or more pairs of second plates at a predetermined distance from both sides of the first plate;
sandwiching parallel to the first plate by one or more pairs of control plates at the predetermined distance from both side of the first plate, and positioned between the two or more pairs of second plates; and
selectively connecting the one or more pairs of control plates to a fixed potential source.

12. The method of claim 11, wherein the selectively connecting the one or more pairs of control plates modifies an electric field between the first plate and the two or more pairs of second plates.

13. The method of claim 11, wherein the selectively connecting the one or more pairs of control plates does not electrically alter a signal going through the variable capacitor.

14. The method of claim 11, comprising connecting the one or more pairs of control plates with a metal layer or the two or more pairs of second plates with a metal layer.

15. The method of claim 11, comprising connecting the one or more pairs of control plates with a first metal layer and the two or more pairs of second plates with a second metal layer.

16. The method of claim 11, comprising forming an equivalent capacitance value with a base capacitance $C_{base}$ in parallel with a capacitance value formed between the first plate and a first control plate of the one or more pairs of control plates denoted as $C_{ax}$ and a capacitance value formed between a second plate of the two or more pairs of second plates and the first control plate denoted as $C_{bx}$.

17. The method of claim 11, further comprising forming a programmable gain amplifier (PGA) by coupling an operational amplifier to the variable capacitor, wherein the two or more pairs of second plates and the first plate form a capacitance value denoted as a base capacitance $C_{base}$ in parallel with a capacitance value formed between the first plate and a first control plate of the one or more pairs of control plates denoted as $C_{ax}$ and a capacitance value formed between a second plate of the two or more pairs of second plates and the first control plate denoted as $C_{bx}$, further comprising a capacitor $C_f$ coupled to an input and an output of the operational amplifier, wherein a PGA gain G comprises:

$$G = -\frac{\left[C_{base} + \frac{C_{ax}C_{bx}}{C_{ax}+C_{bx}}\right]}{C_f} \text{ (switch open)}$$

$$G = -\frac{C_{base}}{C_f} \text{ (switch closed).}$$

18. The method of claim 11, wherein a minimum value of capacitor capacitance step size depends on an overlap area between the first and second plates and control plates.

19. The method of claim 11, comprising providing capacitance density greater than 1 fF/$\mu m^2$.

20. The method of claim 11, comprising providing capacitance variations in step size of approximately 50 attofarad (aF).

* * * * *